(12) United States Patent
Windisch et al.

(10) Patent No.: US 7,435,999 B2
(45) Date of Patent: Oct. 14, 2008

(54) SEMICONDUCTOR CHIP FOR OPTOELECTRONICS AND METHOD FOR THE PRODUCTION THEREOF

(75) Inventors: Reiner Windisch, Pettendorf (DE); Ralph Wirth, Pettendorf-Adlersberg (DE); Walter Wegleiter, Nittendorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/120,774

(22) Filed: May 2, 2005

(65) Prior Publication Data

US 2005/0258444 A1 Nov. 24, 2005

(30) Foreign Application Priority Data

Apr. 30, 2004 (DE) .................. 10 2004 021 175

(51) Int. Cl.
*H01L 33/00* (2006.01)
*H01L 21/00* (2006.01)

(52) U.S. Cl. .................. 257/98; 257/99; 257/E33.006; 257/E33.065; 257/E33.07; 438/27

(58) Field of Classification Search ............. 257/98–99; 438/27
See application file for complete search history.

(56) References Cited

U.S. PATENT DOCUMENTS

| 5,684,309 | A | 11/1997 | McIntosh et al. |
| 5,831,277 | A | 11/1998 | Razeghi |
| 6,486,499 | B1 * | 11/2002 | Krames et al. ............... 257/81 |
| 6,809,340 | B2 * | 10/2004 | Kato et al. .................... 257/79 |
| 6,828,597 | B2 | 12/2004 | Wegleiter et al. |
| 6,849,881 | B1 | 2/2005 | Harle et al. |
| 2002/0017652 | A1 * | 2/2002 | Illek et al. .................... 257/95 |
| 2002/0056848 | A1 * | 5/2002 | Wirth .......................... 257/98 |
| 2003/0062821 | A1 * | 4/2003 | Wegleiter et al. ......... 313/493 |
| 2003/0116771 | A1 | 6/2003 | Wirth |
| 2003/0230754 | A1 | 12/2003 | Steigerwald et al. |
| 2004/0007707 | A1 | 1/2004 | Wirth |

(Continued)

FOREIGN PATENT DOCUMENTS

DE 100 38 671 A1 8/2000

(Continued)

OTHER PUBLICATIONS

I Schnitzer et al., "30% external quantum efficiency from surface textured, thin-film light-emitting diodes", Appl. Phys. Lett., vol. 63, No. 16, pp. 2174-2176, Oct. 18, 1993.

(Continued)

*Primary Examiner*—Ahmed Sefer
(74) *Attorney, Agent, or Firm*—Cohen Pontani Lieberman & Pavane LLP

(57) ABSTRACT

A semiconductor chip for optoelectronics having a thin-film layer, in which a zone that emits electromagnetic radiation is formed and which has an emission side, a rear side and side faces that connect the rear side to the emission side. A carrier for the thin-film layer is arranged at the rear side thereof and is connected thereto. At least one electrical front side contact structure is formed on the emission side and at least one trench is formed on the rear side. The trench defines at least a single partial region which essentially does not overlap the front side contact structure.

34 Claims, 6 Drawing Sheets

U.S. PATENT DOCUMENTS

| | | |
|---|---|---|
| 2004/0084682 A1 | 5/2004 | Illek et al. |
| 2005/0045978 A1* | 3/2005 | Zoelfl et al. ................ 257/428 |

FOREIGN PATENT DOCUMENTS

| | | |
|---|---|---|
| DE | 100 64 448 A1 | 12/2000 |
| DE | 101 47 887 A1 | 9/2001 |
| DE | 102 24 219 A1 | 5/2002 |
| DE | 102 29 231 A1 | 1/2004 |
| EP | 1 017 113 A1 | 1/1998 |
| GB | 2 381 380 A | 4/2003 |
| JP | 01138768 | 5/1989 |
| JP | 04015965 | 1/1992 |
| JP | 04159784 | 6/1992 |
| JP | 06334213 | 12/1994 |
| JP | 07038146 | 2/1995 |
| JP | 07106631 | 4/1995 |
| WO | WO 98/31055 | 7/1998 |
| WO | WO 01/39282 A2 | 5/2001 |
| WO | WO 02/13281 A1 | 2/2002 |

OTHER PUBLICATIONS

European Search Report issued in the corresponding foreign application No. EP 05 00 6138.

* cited by examiner

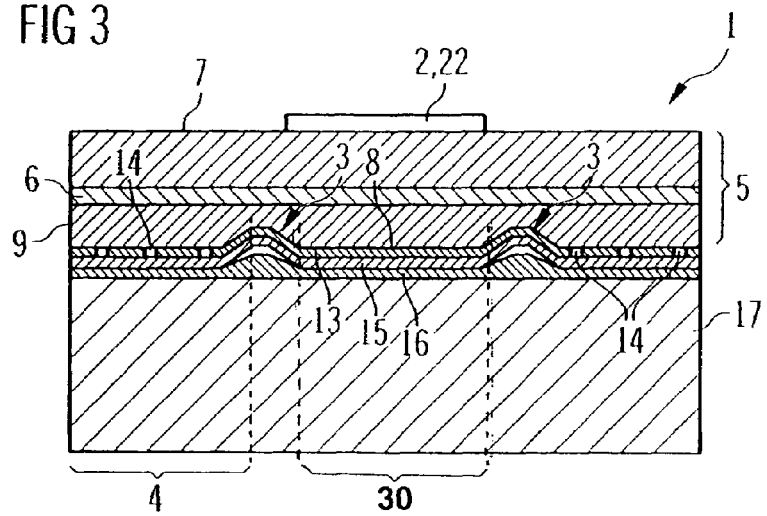
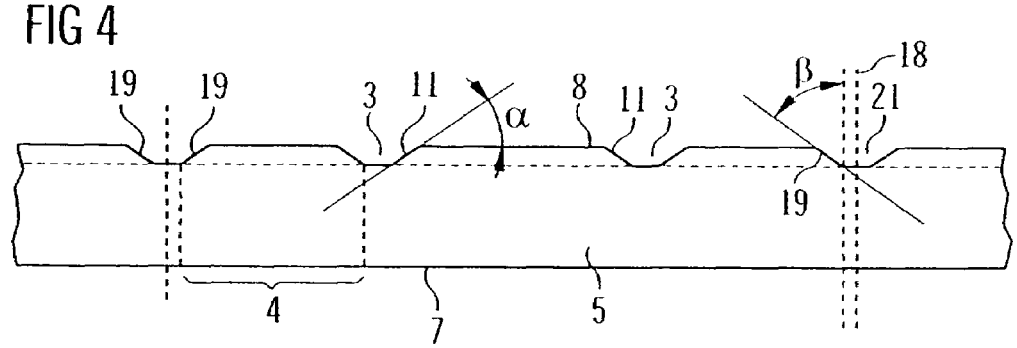
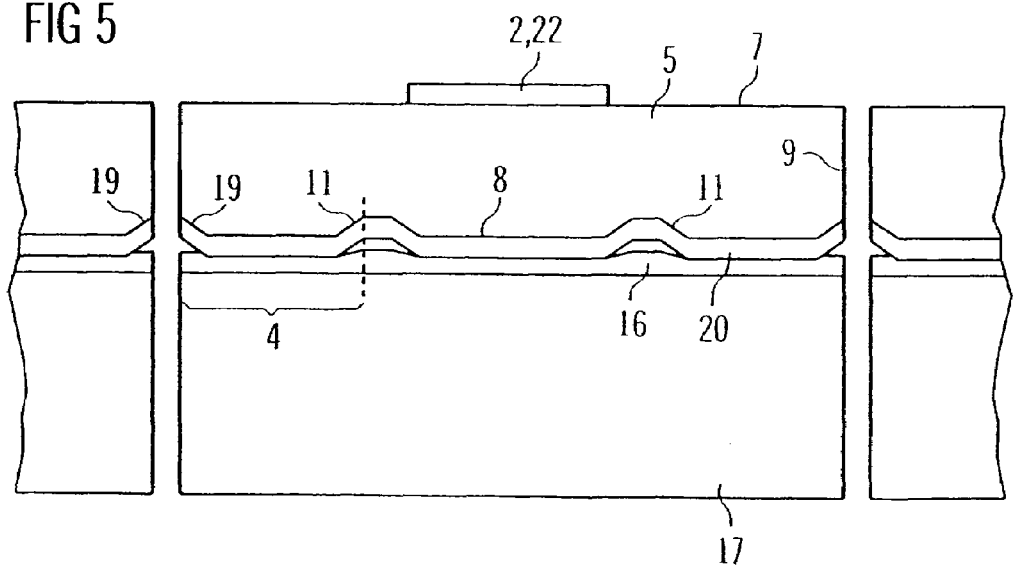

SEMICONDUCTOR CHIP FOR OPTOELECTRONICS AND METHOD FOR THE PRODUCTION THEREOF

RELATED APPLICATIONS

This patent application claims the priority of German patent application No. 10 2004 021 175.2 dated Apr. 30, 2004, the disclosure content of which is hereby incorporated by reference.

1. Field of the Invention

The present invention relates to a semiconductor chip for optoelectronics having a thin-film layer which includes a zone that emits electromagnetic radiation.

2. Background of the Invention

Published U.S. patent application No. 2002/0017652 discloses a semiconductor chip for optoelectronics, for example, which has a thin-film layer connected to a carrier substrate. At least one cavity and, thereby, a multiplicity of mesas are formed in the thin-film layer on the side facing the carrier substrate. The number of mesas is e.g. more than 80.

This multiplicity of mesas on that side of the thin-film layer which faces the carrier substrate advantageously has the effect, on the one hand, that the thin-film layer has, at its connecting side toward the carrier substrate, press-on areas that are small in area relative to the overall cross-sectional area of the chip. The press-on areas have the advantage that a comparatively large local pressure can be generated in the region thereof, such pressure being beneficial for a secure connection of carrier substrate and thin-film layer. At the same time, however, the pressure on the thin-film layer can be kept low enough to preclude as far as possible the risk of damage to the thin-film layer during connection to the carrier substrate.

A further advantage is that the area of the thin-film layer is enlarged on account of the cavity on that side of the thin-film layer which faces the carrier substrate, which may likewise lead to improvement of the connection between carrier substrate and thin-film layer. Moreover, the cavity is available for receiving excess adhesive or soldering material, which advantageously makes the apportioning thereof less critical. In addition, the mesas advantageously create side areas at which a part of the radiation emitted by the active zone of the thin-film layer is deflected in such a way that it impinges within the exit cone of the semiconductor chip on the exit area of the active thin-film layer, such exit area being remote from the carrier substrate. In this case, the reflection at the side areas of the mesas partially or entirely replaces the reflection at a continuous planar reflection layer.

U.S. published application No. 2002/0017652 likewise discloses arranging electrical contact areas on that side of the thin-film layer which faces the carrier substrate only in the region of the press-on areas and additionally outside regions opposite electrical contact areas which are arranged on that side of the thin-film layer which is remote from the carrier substrate. However, this gives rise, in particular between the individual mesas, to regions into which no or only relatively little current can be fed, so that a region of the thin-film layer which is used for generation of light is restricted laterally to a relatively small partial area of the entire semiconductor chip. The consequence of this is that the current-carrying capacity of the semiconductor chips may be relatively low or that a relatively high current density is applied to the semiconductor chip. A relatively high current density may disadvantageously promote ageing processes, such as, for example, a rise in the forward voltage as the operating period increases.

SUMMARY OF THE INVENTION

One object of the present invention is to provide a semiconductor chip of the type mentioned in the introduction which has an improved radiation emission efficiency, that is to say an improved radiation intensity per unit of electrical power consumed.

A further object of the present invention is to provide a method for producing a semiconductor chip of this type.

This and other objects are attained in accordance with one aspect of the invention directed to a semiconductor chip for optoelectronics comprising a thin-film layer, including a zone that emits electromagnetic radiation. The layer includes an emission side, a rear side and side faces that connect the rear side to the emission side. At least one trench is formed on the rear side, and at least one electrical front side contact structure is formed on the emission side, wherein the trench at the rear side defines at least one partial region of the thin-film layer which essentially does not overlap the front side contact structure. A carrier for the thin-film layer is connected to the rear side. Electrical rear side contacts on the rear side are formed only in the partial region, wherein the trench has oblique inner walls with respect to a plane of main extent of the thin-film layer for deflecting electromagnetic radiation emitted from the zone.

In one embodiment of the invention, the trench defines a partial region which lies in a main plane in which the rear side extends so that the partial region is separated, at least as far as possible, from regions in the main plane which lie opposite the front side contact structure. This trench preferably runs essentially along edges of the regions which lie opposite the front side contact structure. For the purpose of deflecting the electromagnetic radiation, the trench has inner walls that are oblique with respect to the main plane in which the thin-film layer extends.

In a thin film layer without trenches, opposite surfaces run substantially parallel to each other. Therefore, if radiation is totally reflected on these surfaces, the angle of incidence substantially does not change and there is no chance for this radiation to couple out of the layer. If, however, the radiation is reflected by a surface which is inclined with respect to the coupling out surface, the angle of incidence to the coupling out surface will be changed and multiple (or "endless") inner relfections can be avoided. This effect can be increased by optimising the structure, e.g. optimising the inclination of the inner walls of the trenches with respect the coupling out surface. The inner walls advantageously run in such a way that a multiple internal reflection is avoided as far as possible and, compared with a semiconductor chip without a trench, a greater proportion of the electromagnetic radiation is coupled out from the chip.

Furthermore, the inner walls preferably run in such a way that radiation from a region of the thin-film structure between the partial region and the emission side which impinges on inner walls is reflected back from the latter into the region of the thin-film structure between the partial region and the emission side. It is advantageous that, as a result, on the emission side, this reflected-back radiation does not impinge on the front side contact structure, by which it would generally be absorbed.

Electrical rear side contacts are preferably formed on the rear side only in the partial region. What is thereby achieved is that, in that region of the thin-film layer which overlaps the front side contact structure, that is to say in the regions between the front side contact structure and the rear side, electromagnetic radiation is not generated or is generated at least with a significantly lower intensity than in the regions between the partial region and the emission side, i.e. in regions of the thin-film layer which lie beside the front side contact structure in a plan view of the thin-film layer.

In one embodiment of the invention, the trench does not define a multiplicity of mesas, but rather a single partial region in which rear side contacts are formed. Since the partial region has a relatively large contiguous area via which the rear side can be electrically conductively contact-connected, the semiconductor chip has a relatively high current-carrying capacity. In addition, the current principally runs above the partial region through the radiation-emitting zone, that is to say between the partial region and the emission side of the thin-film layer. The radiation thereby generated is at least partly prevented by the trench from passing into the region covered by the front side contact structure. Consequently, the trench fulfills a plurality of advantageous functions simultaneously and is in this way used in a particularly effective manner, which may lead to an improved semiconductor chip and, in particular, to a significant increase in the emitted radiation power of the semiconductor chip.

In another embodiment of the invention, the at least one trench defines a plurality of partial regions which lie outside regions of the thin-film layer which overlap the front side contact structure. In a plan view of the thin-film layer, each of said partial regions, at least at one side, apart from a part of the trench that is possibly still arranged in between, is directly adjacent to a region of the thin-film layer which overlaps the front side contact structure. It has been shown that, as long as this condition is met, the advantages of internal deflection at additional inner walls of a trench and associated improved coupling out of the radiation can outweigh possible disadvantages due to a reduced current-carrying capacity and a reduced internally generated radiation intensity.

Preferably, each partial region covers an area of greater than or equal to $(35 \times 35) \, \mu m^2$. In a further preferred embodiment, each partial region has an area of at least $(40 \times 40) \, \mu m^2$. Advantages of partial regions that are as large as possible have already been explained previously.

The trench can have a depth that is less than half the thickness of the thin-film layer. In this case, the depth of the trench is particularly preferably so small that said trench does not damage, in particular sever, the electromagnetic radiation-emitting zone. Preferably, the trench does not penetrate into the radiation-emitting zone. It has been found that penetration into or severing of the radiation-emitting zone leads to a formation of non-radiative recombination centers at the interfaces of the radiation-emitting zone that are uncovered by the trench, which appreciably reduces the internal efficiency and the radiation efficiency of the semiconductor chip. In an advantageous embodiment, the trench has a depth of between 0.5 and 3 µm inclusive. Recombination is a process resulting in annihilation of free charge carriers in a semiconductor. Electrons and holes recombine. Energy is set free by such a recombination process, which can be in the form of electromagnetic radiation (radiative recombination). This energy corresponds to the electric energy which is needed to generate electron hole pairs in the semiconductor. If, however, the radiation is not from a demanded wavelength range (e.g. if it is not visible) or if the recombination is non-radiative, the electric energy is lost. Surface defects at the surface of the acrive zone can form such non-radiative recombination centers. Such surface defects are generated when the trenches reach into or through the active zone.

It has furthermore been found that the radiation can be coupled out from the semiconductor chip more efficiently if planes of main extent of the inner walls of the trench form an angle of inclination of less than or equal to 45° with a plane of main extent of the thin-film layer. For example, the angle of inclination can be between 15° and 35° inclusive. Accordingly, in one embodiment of the invention the trench, compared with semiconductor chips in accordance with the prior art, is shorter, defines relatively large partial regions, is formed with a smaller depth and/or has inner walls whose planes of main extent have a relatively small angle of inclination.

In a further embodiment of the invention, an additional advantageous deflection of the radiation is achieved by virtue of the side faces being bevelled, that is to say running obliquely, at least in an edge region adjoining the rear side, with respect to a plane of main extent of the thin-film layer. Planes of main extent of the obliquely running parts of the side faces are particularly preferably inclined by a sloping angle of greater than or equal to 45° with respect to the perpendicular to the plane of main extent of the thin-film layer. This measure leads to an additional advantageous deflection of the electromagnetic radiation away from the side faces, as a result of which, in an advantageous manner, a smaller portion of the radiation is coupled out from the semiconductor chip laterally via the side faces.

In a further embodiment of the invention, the front side contact structure is formed in comblike fashion with a plurality of conductor arms, the term conductor arms implying that the latter have an end which is not directly connected to further interconnects of the front side contact structure. The front side contact structure can have four to ten conductor arms inclusive. As a result, current can be fed into the semiconductor chip particularly efficiently and uniformly. Preferably, conductor arms arranged in a row run parallel to one another. A plurality of conductor arms arranged in a row furthermore preferably all have identical spacings among one another.

Another aspect of the invention is directed to a method for simultaneously producing a plurality of semiconductor chips for optoelectronics having a thin-film layer, in which a zone that emits electromagnetic radiation is formed. A thin-film layer is formed on a growth substrate by epitaxial growth of a layer sequence, containing the zone that emits electromagnetic radiation. At least one trench is formed to define a single partial region which is outside regions opposite a contact structure to be produced, and the trench has oblique inner walls with respect to a plane of main extent of the thin-film layer. Electrical rear side contacts are formed in the partial region. The thin-film layer is applied on a carrier substrate in such a way that the trench faces the carrier substrate, and the thin-film layer is connected to the carrier substrate. The growth substrate is at least partially removed. An electrical front side contact structure is formed on a side of the thin-film layer opposite to the trench. The assembly comprising the carrier substrate and thin-film layer is singulated along separating lines to form semiconductor chips.

In accordance with an embodiment of a method according to the invention, at least one trench is formed in the thin-film layer in such a way that a single partial region is defined outside regions of the thin-film layer which overlap an envisaged contact structure that is subsequently still to be produced, and that the trench has oblique inner walls with respect to a plane of main extent of the thin-film layer. The electrical rear side contacts are preferably formed in the partial region.

In accordance with an embodiment of a method in accordance with the invention, at least one trench is formed in the thin-film layer in such a way that the trench on the rear side defines a plurality of partial regions which lie outside regions of the thin-film layer that overlap an envisaged front side contact structure that is subsequently still to be produced, and which, as seen in a plan view of the thin-film layer, in each case at least at one side, apart from a part of the trench that is possibly still arranged in between, are directly adjacent to a region of the thin-film layer which overlaps the front side contact structure.

In both of the above-described methods, the rear side contacts are preferably formed prior to the formation of the trench in the regions which are provided for the partial regions or the partial region. It goes without saying that the partial regions do not have to be demarcated by the at least one trench in order that the rear side contacts can be formed in the partial regions or the partial region, i.e. in the regions of the thin-film layer that are provided therefor.

Prior to the application of the thin-film layer on the carrier substrate, at least one separating trench can be formed along the separating lines. The effect that can thereby be achieved is that the side faces of the thin-film layer are at least partly oblique in the case of the subsequently singulated semiconductor chips.

In accordance with a further embodiment of the method, the trench and/or the separating trench is produced by means of etching. In an etching process, the resulting form or the course of the inner walls of the trenches can advantageously be influenced in diverse ways by the process parameters.

BRIEF DESCRIPTION OF THE DRAWINGS

FIG. 3 shows a schematic sectional view of the semiconductor chip taken along line III-III in FIG. 1;

FIG. 4 shows a schematic sectional illustration of the thin-film layer of the semiconductor chip in one stage of the method in accordance with the exemplary embodiment;

FIG. 5 shows a schematic sectional illustration of the thin-film layer of the semiconductor chip in a further stage of the method in accordance with the exemplary embodiment;

DETAILED DESCRIPTION OF THE DRAWINGS

In the exemplary embodiments and Figures, identical or identically acting constituent parts are in each case provided with the same reference symbols. The illustrated elements of the Figures are not to be regarded as true to scale, rather they may in part be illustrated with their size exaggerated and/or not in the actual size relationships, in order to afford better understanding.

Figure 7:
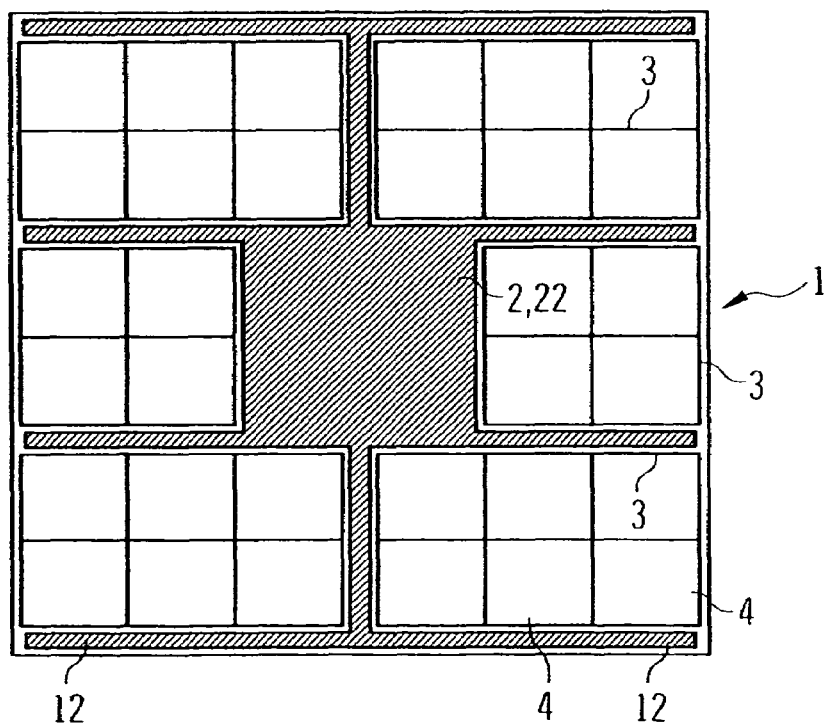
FIG. 7 shows a schematic drawing of a fourth exemplary embodiment of the semiconductor chip in a plan view of the front side contact structure.
Figure 8:
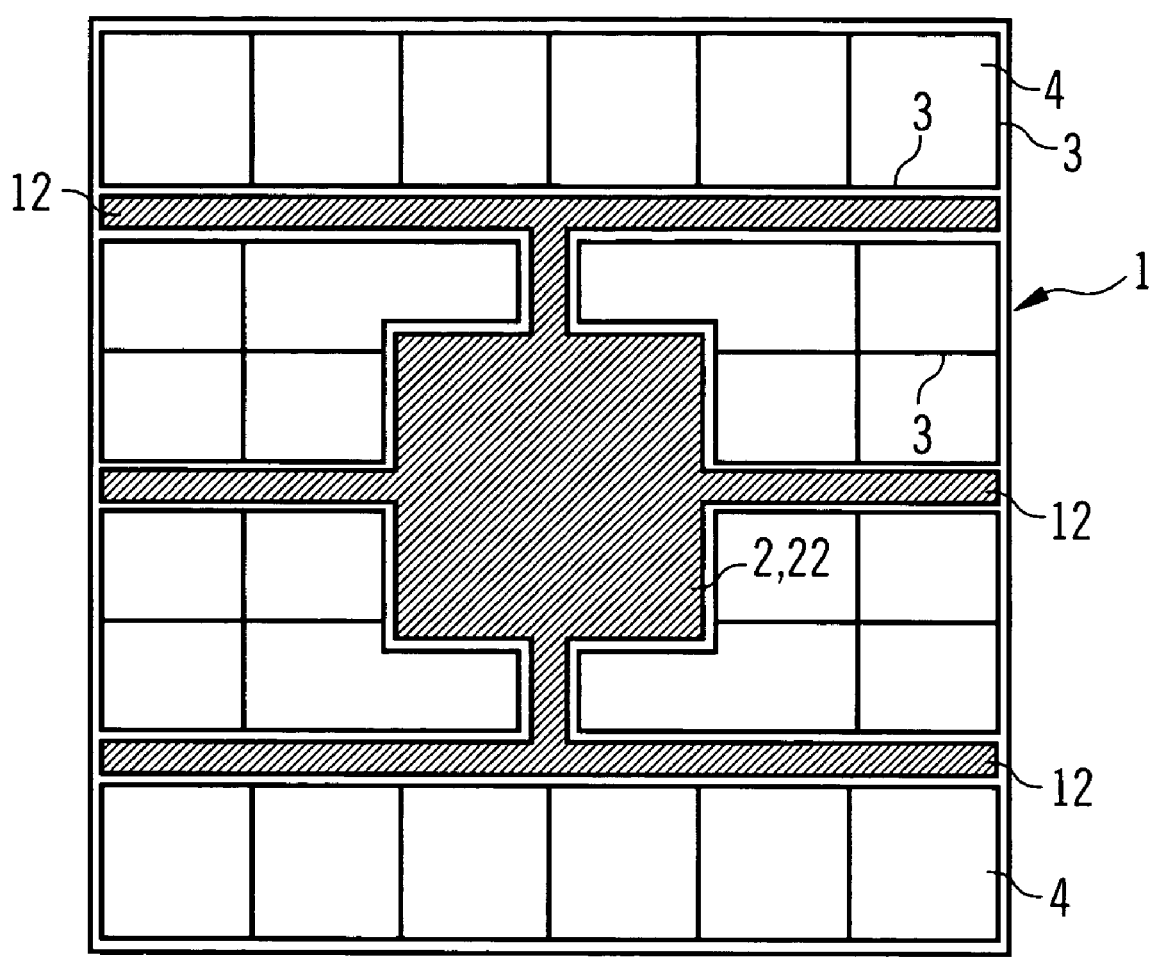
FIG. 8 shows a schematic drawing of a fifth exemplary embodiment of the semiconductor chip in a plan view of the front side contact structure.
Figure 9:
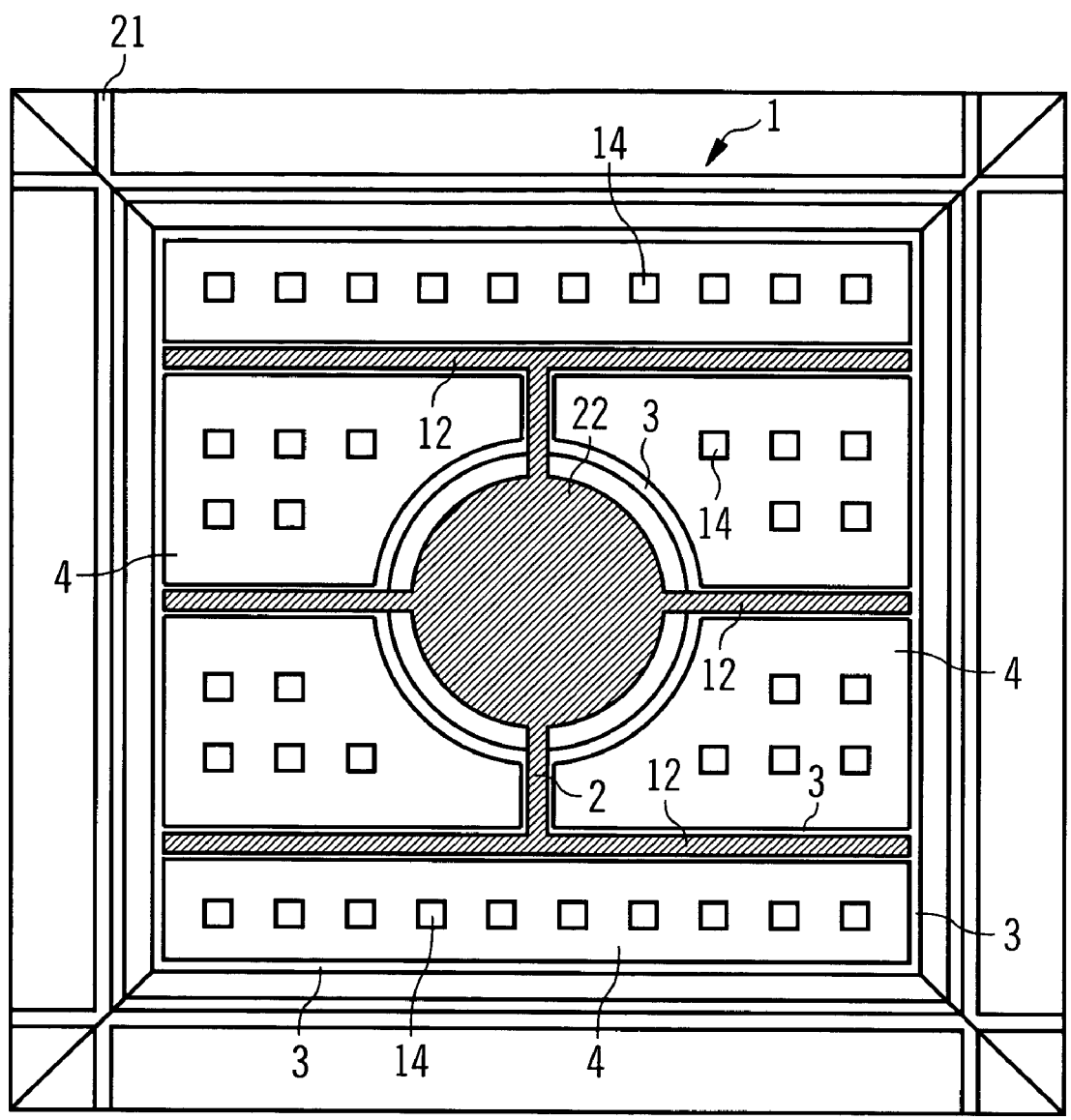
FIG. 9 shows a schematic drawing of a sixth exemplary embodiment of the semiconductor chip in a plan view of the front side contact structure.

FIGS. 1, 2 and 6 to 10 in each case show a semiconductor chip in a plan view of a front side contact structure (2, 22), that is to say that the emission side 7 of the semiconductor chip 1 of the respective exemplary embodiment of the semiconductor chip can be seen. These Figures in each case also indicate at least one trench 3 even though the latter is not formed on the emission side 7 but rather on the rear side 8 of the thin-film layer 5 (which can be discerned in the sectional view of the semiconductor chip as illustrated in FIG. 3) and, therefore, would not be visible per se in the plan views. This form of illustration in FIGS. 1, 2 and also 6 to 10 is intended to improve clarity and afford a better understanding. In this way, it is in only one Figure that both the front side contact structure 2 is visible and a course of the trench 3 is discernible. In FIG. 9, positions of rear side contacts 14, which are likewise arranged on the rear side of the thin-film layer, are also indicated laterally in addition to the trench 3.

Figure 1:
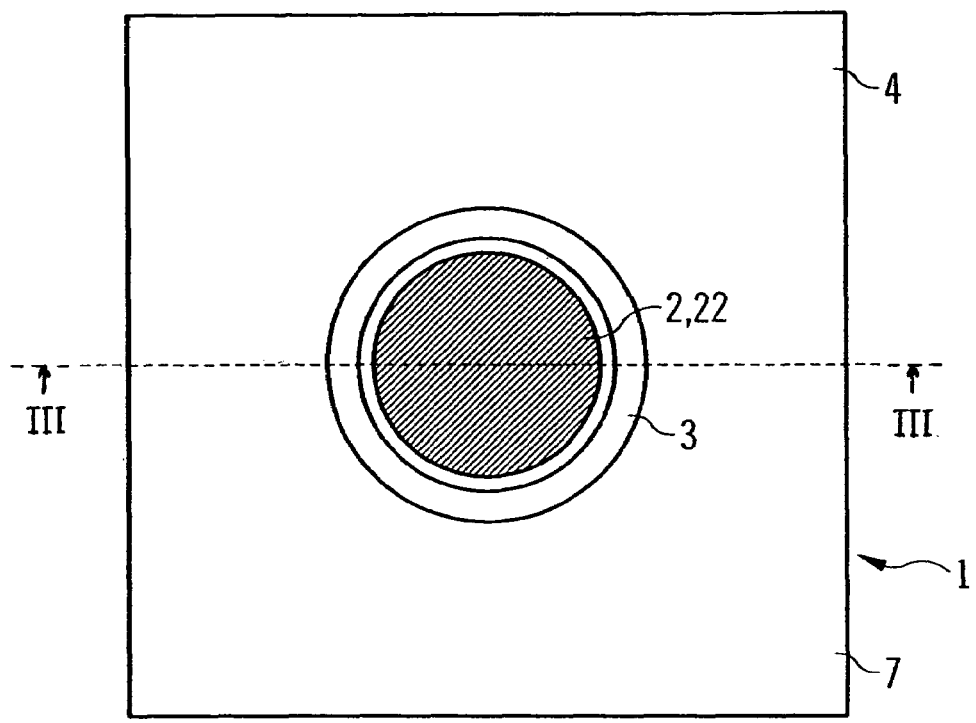
FIG. 1 shows a schematic drawing of a first exemplary embodiment of the semiconductor chip in a plan view.

In the case of the exemplary embodiment illustrated in FIG. 1, the semiconductor chip 1 has a front side contact structure 2 in the form of a circular bonding pad 22. Rear side 8 of the thin-film layer has a region 30 (see FIG. 3) which opposite bonding pad 22, that is to say region 30 overlaps bonding pad 22. A trench 3 is formed on the rear side of the thin-film layer of the semiconductor chip 1, said trench running annularly around region 30 of the thin-film layer. The trench 3 defines a partial region 4 by separating it from region 30. Thus, partial region 4 does not overlap bonding pad 22.

In order for a partial region 4 of this type to be defined, it is not absolutely necessary for the trench to demarcate the latter completely from the region below the front side contact structure. Rather, it is possible for the trench 3 to be interrupted at one or at a plurality of locations. It is equally possible to form, instead of a trench 3, a multiplicity of holes which are formed next to one another and jointly define the partial region. Such structures of recesses on the rear side 8 of the thin-film layer 5 are suitable as an alternative to a trench in principle for an implementation of the invention and are to be understood as analogous to the trench.

FIG. 3 shows a sectional view of the semiconductor chip illustrated in FIG. 1, the section running along the dashed line depicted in FIG. 1. This illustration reveals that the trench 3 is situated on the rear side 8 of the thin-film layer 5. The thin-film layer 5 is based for example on a phosphite or nitride compound semiconductor material.

Phosphite compound semiconductor materials are compound semiconductor materials containing phosphorus, such as e.g. materials from the system $In_xAl_yGa_{1-x-y}P$ where $0 \leq x \leq 1$, $0 \leq y \leq 1$ and $x+y \leq 1$. Analogously, nitride compound semiconductor materials contain nitrogen and comprise, in particular, materials from the system $In_xAl_yGa_{1-x-y}N$ where $0 \leq x \leq 1$, $0 \leq y \leq 1$ and $x+y \leq 1$. The group of radiation-emitting semiconductor chips based on nitride or phosphite compound semiconductor material includes the present semiconductor chips, in particular those semiconductor chips in which the thin-film layer contains at least one individual layer which has a material from the respective compound semiconductor material system.

The thin-film layer may have for example a conventional pn junction, a double heterostructure, a single quantum well structure (SQW structure) or a multiple quantum well structure (MQW structure) which forms an electromagnetic radiation-emitting zone 6. Such structures are known to a person with ordinary skill in the art and, therefore, are not explained in any further detail at this juncture. Examples of such MQW structures are described in the documents U.S. Pat. No. 6,849,881, U.S. Pat. No. 6,172,382, U.S. Pat. No. 5,831,277, U.S. Pat. No. 6,677,619, U.S. Pat. No. 6,849,864 and U.S. Pat. No. 5,684,309, the disclosure content of which is hereby incorporated by reference.

A dielectric layer 13 is formed on the rear side of the thin-film layer 5 and has, in the partial region 4, holes in which electrical rear side contacts 14 in the form of contact vias are formed. An electrically conductive layer 15, which is reflective to the electromagnetic radiation, is formed on the dielectric layer 13. Said electrically conductive layer may have e.g. a suitable metal such as, for example, silver or gold.

The thin-film layer 5 is connected to a carrier substrate 17 by means of a solder layer 16. The carrier substrate essentially comprises e.g. SiC, GaAs or Ge. Instead of a solder layer, an electrically conductive adhesive, for example, may also be used for this. In the case of a carrier substrate 17 that is not electrically conductive, an electrically insulating material is also suitable for this purpose.

In the case of the method for producing the semiconductor chip, the thin-film layer 5 is grown on a growth substrate. Afterward, said growth substrate is at least partially removed from the thin-film layer and the thin-film layer is applied to a carrier substrate. In this case, the growth substrate may be removed either after or before the application of the thin-film layer on the carrier substrate. These method steps are preferably effected after the formation of the trenches.

After the formation of the thin-film layer, at least one trench 3 is formed in the rear side 8 thereof, which is illustrated in FIG. 4. This may be done e.g. by means of forming an etching mask, e.g. by photolithography, and etching with an etchant suitable for the respective etching material. The requisite measures and suitable materials for this are generally known to a person with ordinary skill in the art and, therefore, are not explained any further at this juncture.

The trench has, for example, a depth of approximately 2 µm and has inner walls 11 whose planes of main extent are inclined by an angle α with respect to a plane of main extent of the thin-film layer 5 (see FIG. 4). The angle α is 30°, by way of example.

The depth of the trenches 3 is less than half the thickness of the thin-film layer 5 and so small that the trenches 3 do not damage or sever the radiation-emitting zone 6 of the thin-film layer.

In the case of the exemplary embodiment illustrated in FIG. 4, in addition to the trenches 3, separating trenches 21 are also formed along separating lines 18. These may be formed like the trenches 3, for example, so that the inner walls of the separating trenches 21, after the singulation of the thin-film layer 5 and the carrier substrate 17, form oblique edge regions 19 of the thin-film layer 5 whose planes of main extent are inclined by a sloping angle β with respect to the perpendicular to the plane of main extent of the thin-film layer 5. The sloping angle β is depicted in FIG. 4 and is 60° by way of example.

The inner walls 11, 19 of the trenches 3 and separating trenches 21 are generally not formed in planar fashion, but rather may have e.g. a concave or convex form.

After the formation of the trenches 3 and separating trenches 21, a contact and mirror layer 20 is formed on the rear side 8 of the thin-film layer 5. Said contact and mirror layer may comprise, as in the case of the exemplary embodiment explained with reference to FIG. 3, a dielectric layer 13 with electrical rear side contacts 14 in the form of contact vias and also a layer 15 that reflects electromagnetic radiation. As an alternative, however, it is also possible, for example, for the contact and mirror layer 20 to comprise a radiation-transmissive and electrically conductive contact layer and an electrically conductive mirror layer applied on the latter (not illustrated). The contact layer has ZnO, by way of example.

The transparent contact layer serves as rear side contact and is applied to the thin-film layer 5 only in the partial region or the partial regions 4 in order that current can be fed into the thin-film layer 5 only in these regions of the rear side 8. The fact that the rear side contact is formed only in the partial regions means that, in the semiconductor chips 1, no or only relatively little electromagnetic radiation is generated in a region between the front side contact structure 2 and the rear side 8. This measure makes it possible for the most part to prevent electromagnetic radiation from being absorbed by the front side contact structure, which increases the efficiency of the semiconductor chips.

In addition, electromagnetic radiation generated in a region of the thin-film layer 5 between the partial region 4 and the emission side 7 is at least partly prevented by the trenches 3 from passing into the region below the front side contact structure 2. At the inner walls 11 of the trenches 3 which face the partial region 4, the electromagnetic radiation impinging thereon is reflected away from the region below the front side contact structure and reflected toward a region of the emission side 7 in which it can be coupled out from the semiconductor chip 1.

The oblique edge regions 19 correspondingly ensure that electromagnetic radiation which, without the oblique edge regions 19, would be coupled out from the semiconductor chip 1 via the side faces 9 is reflected away from the side faces 9 and in the direction of the emission side 7. This also improves the efficiency of the semiconductor chip 1.

Figure 6:
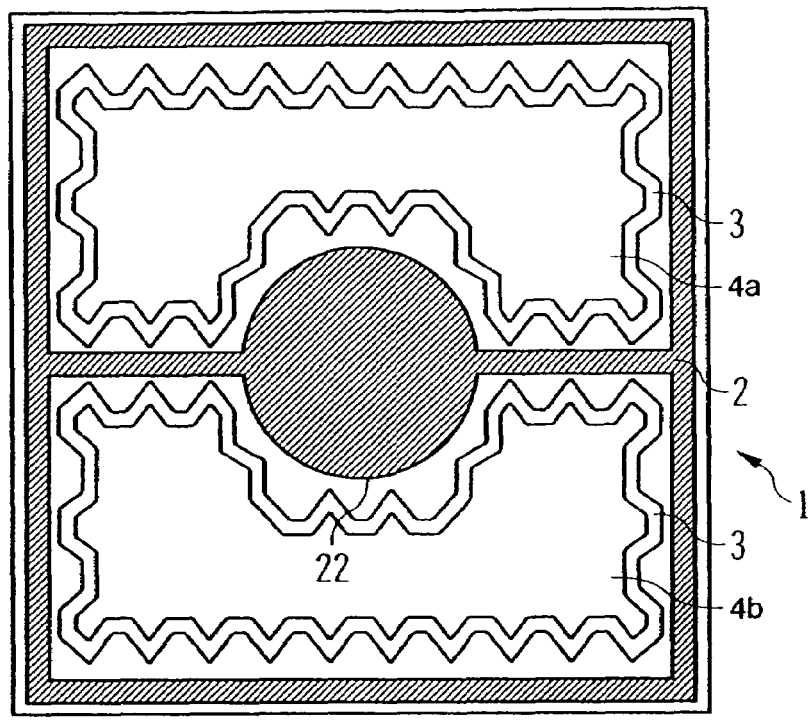
FIG. 6 shows a schematic drawing of a third exemplary embodiment of the semiconductor chip in a plan view of the front side contact structure.

FIG. 6 illustrates a further exemplary embodiment of the semiconductor chip 1. In this case, the front side contact structure 2 comprises not only a bonding pad 22 but additionally a leadframe 2a running along the edge of the semiconductor chip 1, and also two interconnect pieces 2b that electrically conductively connect the bonding pad 22 to the leadframe. As a result, this semiconductor chip has, on the rear side of the thin-film layer 5, two regions 4a, 4b that are separate from one another and which do not overlap region 30 on the rear surface opposite the front side contact structure 2. A trench 3 is formed in each of these regions 4a, 4b, said trench running in a closed track along the edges of the regions opposite the front side contact structure. These two trenches 3 define the two partial regions 4a, 4b.

Figure 2:
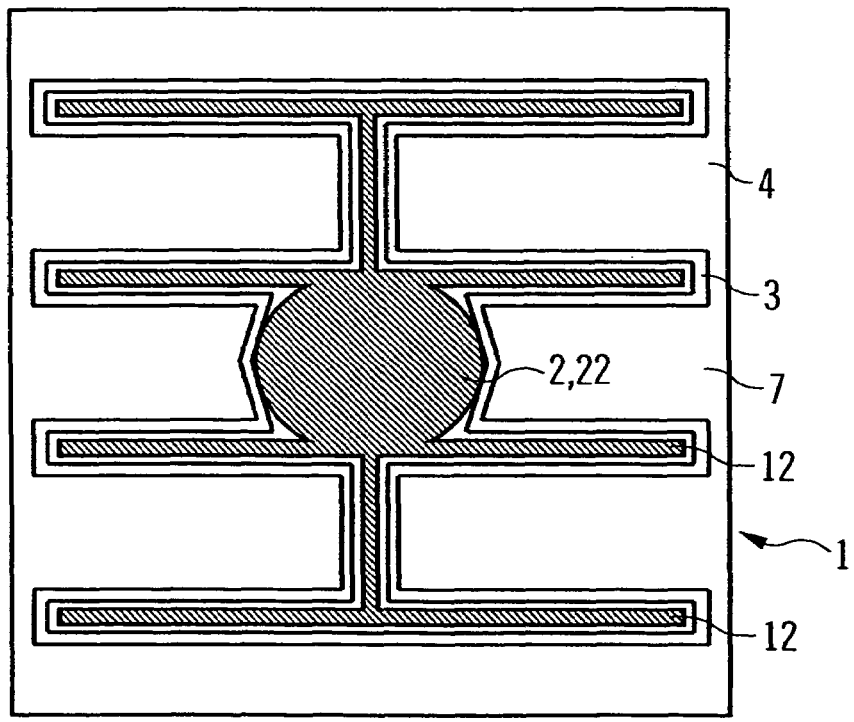
FIG. 2 shows a schematic drawing of a second exemplary embodiment of the semiconductor chip in a plan view.

In contrast to the trenches 3 illustrated in FIGS. 1 and 2, the trenches 3 in the case of the semiconductor chip in accordance with FIG. 6 run in a jagged track. As a result, the inner walls of the trenches 3 have a multiplicity of different orientations, as a result of which multiple internal reflection of electromagnetic radiation can be further reduced and a coupling-out of radiation can be improved.

In the case of the exemplary embodiment of the semiconductor chip 1 as illustrated in FIG. 2, the front side contact structure 2 comprises, besides a bonding pad 22, eight conductor arms 12, of which four proceed from the bonding pad and the remaining four are connected to the bonding pad by a total of two interconnect pieces. The conductor arms 12 essentially run parallel to one another, so that the front side contact structure 2 is formed in comblike fashion.

To put it another way, the front side contact structure 2 illustrated in FIG. 2 has four separate straight lines which do not intersect and of which the middle two are electrically conductively connected by a bonding pad 22, and the outer two straight lines are electrically conductively connected by two interconnect pieces to the bonding pad 2 and thus also to the middle two straight lines. As an alternative, the outer two straight lines could also be electrically conductively connected to the inner straight lines instead of to the bonding pad 22.

The conductor arms in the form of straight lines are approximately equidistant from one another so as to be distributed uniformly, as far as possible, over the area of the emission side 7 of the semiconductor chip 1. The distance between the straight lines is less than or equal to 100 μm and is e.g. 80 μm. This enables current to be fed in very uniformly over the entire emission side of the thin-film layer 5.

In the case of the exemplary embodiment illustrated in FIG. 2, the trench 3 is formed on the rear side of the thin-film layer 5 in a closed track along the edge of the regions which overlap the front side contact structure 2. As a result, a single partial region 4 is likewise formed as in the case of the exemplary embodiment in accordance with FIG. 1, but the comblike front side contact structure 2 brings about an improved feeding-in of current in the region between the partial region and the emission side 7.

The semiconductor chip 1 illustrated in FIG. 7 likewise has a comblike front side contact structure 2 with eight conductor arms 12 in the form of four interconnect straight lines. In this case, the outer straight lines run along the edge of the semiconductor chip 1, so that no partial region or part of a partial region is situated between the outer straight lines and the edge of the semiconductor chip, that is to say that between the outer straight lines and the respectively adjacent edge of the semiconductor chip there is also no trench running on the rear side 8 of the thin-film layer 5.

The semiconductor chip illustrated in FIG. 7 has a multiplicity of trenches 3 which, in contrast to FIGS. 1, 2 and 6, are symbolized by simple lines. The trenches 3 run not only along the edge of regions which overlap the front side contact structure 2. There are also trenches 3 which essentially extend away from the edges of the regions opposite the front side contact structure, in particular extend away essentially perpendicularly from them. As a result, either six or four partial regions are defined between two adjacent conductor arms 12, which partial regions have a form that is like a truncated pyramid on the rear side in this exemplary embodiment. Overall, the semiconductor chip 1 has 32 partial regions 4, each partial region 4 being directly adjacent at least to one region opposite the front side contact structure. This brings about the best possible feeding-in of current into the active zone between the partial region and the emission side 7.

Each of said partial regions has an area of $(37\times37)$ μm$^2$, by way of example. In an alternative exemplary embodiment, this area may be more than $(40\times40)$ μm$^2$, for example $(42\times42)$ μm$^2$.

The formation of a plurality of partial regions advantageously also results in the formation of a plurality of trenches with inner walls at which the electromagnetic radiation is reflected or deflected in the direction of the emission side 7 essentially in such a way that it is coupled out from the semiconductor chip at the emission side. The number of partial regions or trenches must not become too large, however, since otherwise the electric current is fed into the semiconductor chip on an excessively small area on the rear side. This might adversely affect the current-carrying capacity of the semiconductor chip. For example, the number of partial regions preferably does not exceed 50, and it can have less than 40 or even less than 30 partial regions.

A very high efficiency could be achieved with a semiconductor chip whose front side contact structure and whose partial regions were formed in accordance with the exemplary embodiment illustrated in FIG. 7. Given a current of 20 mA, a radiation power of approximately 96 lm/W could be achieved in this case, the radiation intensity being measured at a wavelength of 610 nm. It is estimated that with a semiconductor chip according to the invention it is possible to achieve a radiation power of 80 lm/W in a reproducible manner.

In order that the electromagnetic radiation is coupled out from the semiconductor chip as well as possible, the emission side 7 of the thin-film layer 5 is provided with a texturing, for example, or roughened. Suitable roughening structures and also methods for producing them are described e.g. in German patent applications 10229231 and 10064448, the disclosure content of which is hereby incorporated by reference.

In addition to the emission side, it is also possible for the entire free surface of the thin-film layer to be roughened.

By way of example, the thin-film layer is roughened in a plasma reactor, at least one mask gas being introduced, which forms a mask layer in the state of island growth on a surface of the thin-film layer, and at least one gas or gas mixture that etches the surface of the thin-film layer being introduced into the plasma reactor. The mask gas used may be a polymer-forming gas which contains e.g. at least one element from the group $SF_6$, $CF_4$, $CHF_3$, $BF_3$ and $BCl_3$. The etching gas contains e.g. oxygen and/or chlorine gas.

As an alternative or in addition, it is possible to use a roughening method in which a mask material is applied to a material layer of the thin-film layer that is to be patterned, the wetting properties of said mask material being chosen in such a way that it forms a patterning layer on the material layer to be patterned. The patterning mask has e.g. a multiplicity of islands that are separate from one another or at least partly interlinked with one another. The material layer to be patterned is patterned by means of a material-removing process step.

The material layer to be patterned is patterned for example at least in part by means of a barrel etching method, a plasma etching method, a reactive ion etching method or a reactive ion beam etching method. The mask material has e.g. a metallic material such as Ag.

In the case of the exemplary embodiment of the semiconductor chip as illustrated in FIG. 8, the front side contact structure has only six conductor arms 12, in contrast to the front side contact structure illustrated in FIG. 7. In this exemplary embodiment too, the trenches 3 define a plurality of partial regions 4, it also being the case that partial regions 4 are defined, or trenches 3 are formed, between the outer conductor arms 12 and the chip edge adjacent thereto. A front side contact structure of this type also enables the regions of the radiation-emitting zone which lie between the partial regions and the emission side to be energized as uniformly as possible.

The semiconductor chip 1 illustrated in FIG. 9 is similar to the semiconductor chip explained above with reference to FIG. 8. The front side contact structure 2 has a round bonding pad 22 and six conductor arms 12, of which two proceed from the bonding pad and the remaining four are connected to the bonding pad by a total of two interconnect pieces. The conductor arms 12 essentially run parallel to one another, so that the front side contact structure is formed in comblike fashion.

The bonding pad 22 is essentially arranged in the center of the front side of the semiconductor chip 1. As an alternative, in all of the exemplary embodiments explained, it is also possible for the bonding pad 22 to be arranged in an offset manner on the front side of the semiconductor chip 1, in particular also at the edge of the semiconductor chip 1.

If the bonding pad 22 is arranged at the edge of the semiconductor chip 1, then it may be advantageous, for example, for the conductor arms 12 to proceed only on one side from the bonding pad 22 and/or from interconnect pieces connected to the bonding pad, so that, by way of example, a front side contact structure 2 with six conductor arms becomes one with only three conductor arms. This furthermore involves separate interconnect straight lines which do not intersect and which are electrically conductively connected to one another by a bonding pad 22 and/or by interconnect pieces, this connection being formed at the edge of the semiconductor chip 1 instead of in a central region of the front side of said semiconductor chip.

Expressed in general terms, the front side contact structure 2 has four to ten conductor arms inclusive and/or two to five interconnect straight lines inclusive.

In the case of the semiconductor chip 1 illustrated in FIG. 9, the trench 3 which runs on the rear side of the thin-film layer essentially along the edges of the front side contact structure 2 and of the semiconductor chip 1 defines a total of six partial regions 4. The partial regions 4 are in addition also laterally separated from one another by the front side contact structure 2.

Each partial region 4 may be assigned a single or a plurality of rear side contacts 14. In the case of the semiconductor chip illustrated in FIG. 9, each partial region 4 is assigned a plurality of rear side contacts 14, that is to say that the rear side of the thin-film layer has, in each partial region 4, a plurality of partial areas which are separate from one another and at which the thin-film layer is electrically conductively contact-connected by means of electrical contact material.

As an alternative, these separate partial areas or the rear side contacts may be partly or completely connected to one another.

In the case of the semiconductor chip 1 illustrated in FIG. 9, the four central partial regions 4 in each case have five rear side contacts 14, while the outer two partial regions 4, which extend in striplike fashion along an edge of the semiconductor chip 1, in each case have ten rear side contacts 14.

In general, each partial region 4 may expediently have between two and 20 rear side contacts inclusive. Preferably, each partial region 4 is assigned between three and ten rear side contacts 14 inclusive. Particularly preferably, each partial region 4 comprises between five and ten rear side contacts inclusive.

The semiconductor chip 1 has for example a chip edge length of less than or equal to 400 µm, preferably of less than or equal to 300 µm. For such small semi-conductor chips, in particular the front side contact structures 2 illustrated in FIGS. 1, 2 and 5 to 9 and/or the division of the partial regions 4 of the semiconductor chips 1 are suitable.

As already explained previously, a semiconductor chip according to an embodiment of the invention can also be scaled in particular toward larger dimensions, however. Thus, the chip can also have a chip edge length of greater than or equal to 1000 µm.

Figure 10:
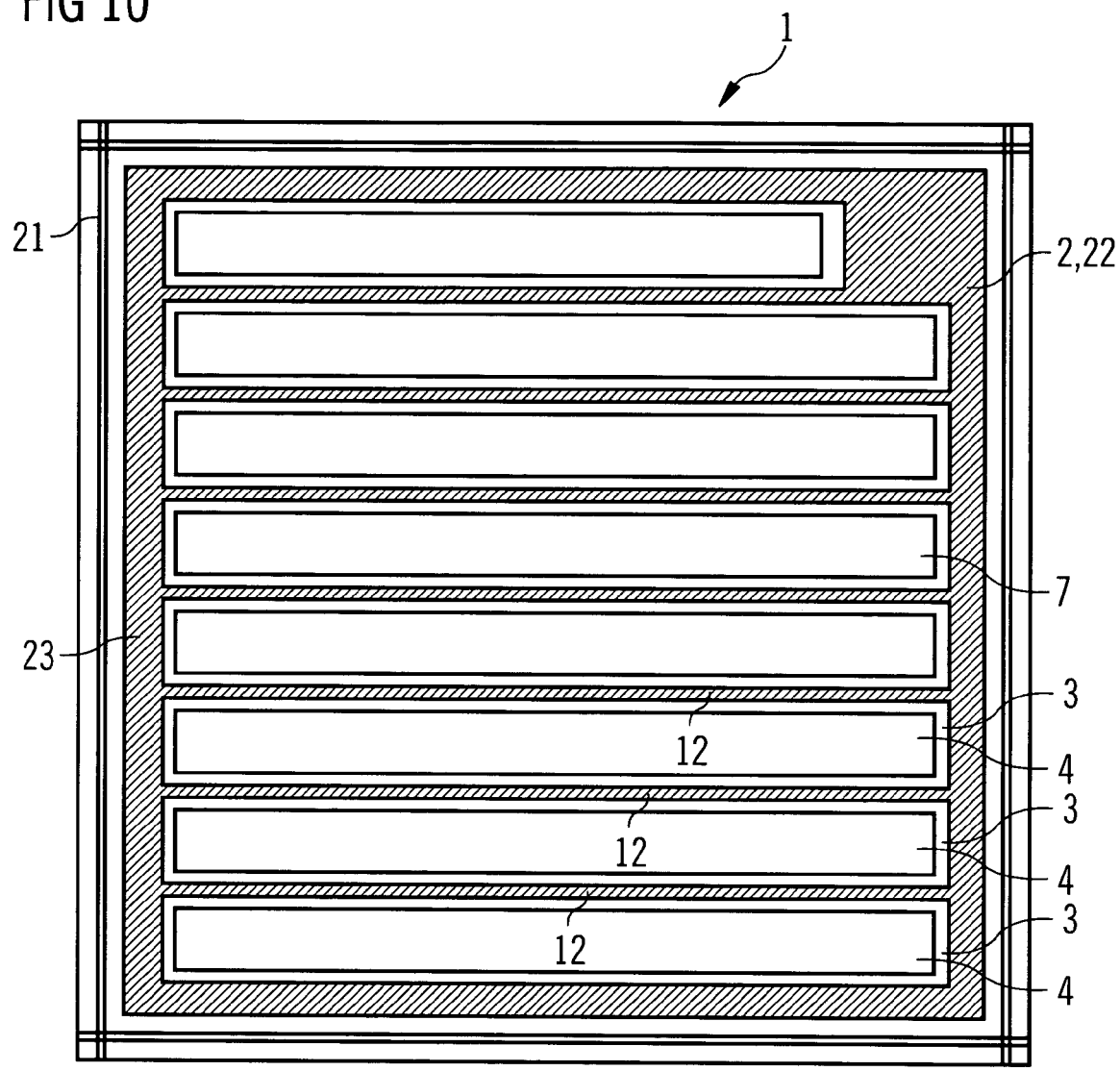
FIG. 10 shows a schematic drawing of a seventh exemplary embodiment of the semiconductor chip in a plan view of the front side contact structure.

In the case of semiconductor chips 1 having particularly large dimensions, a front side contact structure 2 and/or division of the partial regions 4 such as in the case of the semiconductor chip 1 illustrated in FIG. 10 may be advantageous. The partial regions 4 have a striplike form and are essentially arranged parallel to one another. The bonding pad 2 is arranged at the edge of the semiconductor chip. It is situated in a corner of the semiconductor chip in this example, it being possible for the front side of the thin-film layer to have not just four but any desired number of corners. The front side contact structure 2 additionally has a plurality of conductor arms 12 which essentially run along the striplike partial regions 4. The conductor arms 12 are arranged in such a way that each partial region 4 laterally adjoins an interconnect arm 12 on both longitudinal sides.

The conductor arms 12 are connected to the bonding pad 22 by an interconnect piece proceeding from the bonding pad 22 or they extend directly away from the bonding pad. The interconnect piece extends along a first side edge of the semiconductor chip 1. In addition or as an alternative, the front side contact structure 2 has, on an opposite side edge of the semiconductor chip 1 to the first side edge, an interconnect piece 23 which electrically conductively connects the conductor arms 12 to one another and essentially extends perpendicular to the conductor arms 12.

If both interconnect pieces are contained in the front side contact structure 2, then the latter has a latticelike form. The partial regions 4 are arranged, seen laterally, within the clearances of such a latticelike front side contact structure 2. One advantage of the latticelike front side contact structure is that it can be interrupted at a location without various of its parts necessarily being electrically isolated from one another. Consequently, it is possible to significantly reduce a sensitivity toward damage to the front side contact structure in the case of semiconductor chips. This is advantageous particularly in the case of front side contact structures with relatively narrow and long contact tracks.

The above-mentioned U.S. published patent application No. 2002/0017652 discloses more extensive details with regard to suitable materials for the thin-film layer, the electrical contacts and reflective layers and also for dopant concentrations and method steps such as the singulation of the assembly comprising thin-film layer and carrier substrate. In this respect, the disclosure content of such application is hereby incorporated by reference.

The invention either makes it possible to produce semiconductor chips which, with respect to semiconductor chips in accordance with the prior art, are of approximately the same size and in this case have a better efficiency and greater radiation power. As an alternative, it is also possible to produce semiconductor chips which have a radiation power of approximately the same magnitude but which, on account of a higher efficiency, have a smaller size than conventional semiconductor chips; that is to say that, by means of the invention, conventional semiconductor chips can be miniaturized without losses with regard to their radiation power.

The semiconductor chip is, in particular, a thin-film light emitting diode chip which can include the following features:

a reflective layer is applied or formed at a first main area—facing a carrier element—of a radiation-generating epitaxial layer sequence or thin-film layer, which reflective layer reflects at least a part of the electromagnetic radiation generated in the epitaxial layer sequence back into the latter;

the epitaxial layer sequence has a thickness in the region of 20 µm or less, in particular in the region of 10 µm; and the epitaxial layer sequence contains at least one semiconductor layer with at least one area which has an intermingling structure which ideally leads to an approximately ergodic distribution of the light in the epitaxial layer sequence, i.e. it has an as far as possible ergodically stochastic scattering behavior.

A basic principle of a thin-film light emitting diode chip is described for example in I. Schnitzer et al., Appl. Phys. Lett. 63 (16), Oct. 18, 1993, 2174-2176, the disclosure content of which is in this respect hereby incorporated by reference.

The scope of protection of the invention is not restricted by the description of the invention on the basis of the exemplary embodiments. Rather, the invention encompasses any new feature and also any combination of features, which comprises in particular any combination of features in the patent claims, even if this feature or this combination itself is not explicitly specified in the patent claims or exemplary embodiments.

We claim:

1. A semiconductor chip for optoelectronics comprising:
   a thin-film layer, including a zone that emits electromagnetic radiation, said layer having an emission side, a rear side and side faces that connect the rear side to the emission side, and at least one trench formed on the rear side;
   at least one electrical front side contact structure formed on the emission side, wherein the trench at said rear side defines a plurality of partial regions of the thin-film layer which essentially do not overlap the front side contact structure and with each one of the plurality of partial regions defined by the trench being adjacent to at least one region that overlaps the front side contact structure, said plural partial regions collectively comprise all regions defined by the trench at said rear side which essentially do not overlap the front side contact structure;
   a carrier for the thin-film layer connected to said rear side; and
   electrical rear side contacts on the rear side formed only in each of said plural partial regions;
   wherein the trench has oblique inner walls with respect to a plane of main extent of the thin-film layer for deflecting electromagnetic radiation emitted from said zone.

2. The semiconductor chip as claimed in claim 1, wherein said plural partial regions cover an area of greater than or equal to (35×35) μm².

3. The semiconductor chip as claimed in claim 2, wherein said plural partial regions cover an area of greater than or equal to (40×40) μm².

4. The semiconductor chip as claimed in claim 1, wherein the trench has a depth that is less than half a thickness of the thin-film layer.

5. The semiconductor chip as claimed in claim 1, wherein the trench has a depth of between 0.5 and 3 μm inclusive.

6. The semiconductor chip as claimed in claim 1, wherein the trench tapers with increasing depth, and the inner walls of the trench have planes of main extent which form an angle of inclination of less than or equal to 42° with a plane of main extent of the thin-film layer.

7. The semiconductor chip as claimed in claim 6, wherein the angle of inclination is between 15° and 35° inclusive.

8. The semiconductor chip as claimed in claim 1, wherein the side faces run obliquely, at least in an edge region adjoining the rear side, with respect to a plane of main extent of the thin-film layer.

9. The semiconductor chip as claimed in claim 8, wherein planes of main extent of the obliquely running parts of the side faces are inclined by a sloping angle of greater than or equal to 45° with respect to the perpendicular to the plane of main extent of the thin-film layer.

10. The semiconductor chip as claimed in claim 1, wherein the front side contact structure is formed in comblike fashion with a plurality of conductor arms.

11. The semiconductor chip as claimed in claim 10, wherein the front side contact structure has 4 to 10 conductor arms, inclusive.

12. The semiconductor chip as claimed in claim 1, wherein the zone that emits electromagnetic radiation is not interrupted by said trench.

13. The semiconductor chip as claimed in claim 1, wherein a free surface of the thin-film layer is partially or completely roughened.

14. A semiconductor chip for optoelectronics comprising:
    a thin-film layer, including a zone that emits electromagnetic radiation, said layer having an emission side, a rear side and side faces that connect the rear side to the emission side, and at least one trench formed on the rear side;
    at least one electrical front side contact structure formed on the emission side, wherein the trench at said rear side defines at least one partial region of the thin-film layer which essentially does not overlap the front side contact structure;
    a carrier for the thin-film layer connected to said rear side; and electrical rear side contacts on the rear side formed only in said partial region;
    wherein the trench has oblique inner walls with respect to a plane of main extent of the thin-film layer for deflecting electromagnetic radiation emitted from said zone and has a depth that is less than half a thickness of the thin-film layer.

15. The semiconductor chip as claimed in claim 14, wherein each partial region covers an area of greater than or equal to (35×35) μm².

16. The semiconductor chip as claimed in claim 14, wherein each partial region covers an area of greater than or equal to (40×40) μm².

17. The semiconductor chip as claimed in claim 14, wherein the trench has a depth of between 0.5 and 3 μm inclusive.

18. The semiconductor chip as claimed in claim 14, wherein the trench tapers with increasing depth, and the inner walls of the trench have planes of main extent which form an angle of inclination of less than or equal to 42° with a plane of main extent of the thin-film layer.

19. The semiconductor chip as claimed in claim 18, wherein the angle of inclination is between 15° and 35° inclusive.

20. The semiconductor chip as claimed in claim 14, wherein the side faces run obliquely, at least in an edge region adjoining the rear side, with respect to a plane of main extent of the thin-film layer.

21. The semiconductor chip as claimed in claim 20, wherein planes of main extent of the obliquely running parts of the side faces are inclined by a sloping angle of greater than or equal to 45° with respect to the perpendicular to the plane of main extent of the thin-film layer.

22. The semiconductor chip as claimed in claim 14, wherein the front side contact structure is formed in comblike fashion with a plurality of conductor arms.

23. The semiconductor chip as claimed in claim 22, wherein the front side contact structure has 4 to 10 conductor arms, inclusive.

24. The semiconductor chip as claimed in claim 14, wherein the zone that emits electromagnetic radiation is not interrupted by said trench.

25. A semiconductor chip for optoelectronics comprising:
    a thin-film layer, including a zone that emits electromagnetic radiation,
    said layer having an emission side, a rear side and side faces that connect the rear side to the emission side, and at least one trench formed on the rear side, the side faces running obliquely, at least in an edge region adjoining the rear side, with respect to a plane of main extent of the thin-film layer;
    at least one electrical front side contact structure formed on the emission side, wherein the trench at said rear side defines at least one partial region of the thin-film layer which essentially does not overlap the front side contact structure;

a carrier for the thin-film layer connected to said rear side; and electrical rear side contacts on the rear side formed only in said partial region;

wherein the trench has oblique inner walls with respect to a plane of main extent of the thin-film layer for deflecting electromagnetic radiation emitted from said zone.

26. The semiconductor chip as claimed in claim 25, wherein each partial region covers an area of greater than or equal to $(35 \times 35)$ $\mu m^2$.

27. The semiconductor chip as claimed in claim 26, wherein each partial region covers an area of greater than or equal to $(40 \times 40)$ $\mu m^2$.

28. The semiconductor chip as claimed in claim 25, wherein the trench has a depth of between 0.5 and 3 $\mu m$ inclusive.

29. The semiconductor chip as claimed in claim 25, wherein the trench tapers with increasing depth, and the inner walls of the trench have planes of main extent which form an angle of inclination of less than or equal to 42° with a plane of main extent of the thin-film layer.

30. The semiconductor chip as claimed in claim 29, wherein the angle of inclination is between 15° and 35° inclusive.

31. The semiconductor chip as claimed in claim 25, wherein planes of main extent of the obliquely running parts of the side faces are inclined by a sloping angle of greater than or equal to 45° with respect to the perpendicular to the plane of main extent of the thin-film layer.

32. The semiconductor chip as claimed in claim 25, wherein the front side contact structure is formed in comblike fashion with a plurality of conductor arms.

33. The semiconductor chip as claimed in claim 32, wherein the front side contact structure has 4 to 10 conductor arms, inclusive.

34. The semiconductor chip as claimed in claim 25, wherein the zone that emits electromagnetic radiation is not interrupted by said trench.

* * * * *